US010312358B2

United States Patent
Ren et al.

(10) Patent No.: US 10,312,358 B2
(45) Date of Patent: Jun. 4, 2019

(54) HIGH ELECTRON MOBILITY TRANSISTORS WITH IMPROVED HEAT DISSIPATION

(71) Applicant: UNIVERSITY OF FLORIDA RESEARCH FOUNDATION, INCORPORATED, Gainesville, FL (US)

(72) Inventors: Fan Ren, Gainesville, FL (US); Stephen John Pearton, Gainesville, FL (US); Mark E. Law, Gainesville, FL (US); Ya-Hsi Hwang, Gainesville, FL (US)

(73) Assignee: UNIVERSITY OF FLORIDA RESEARCH FOUNDATION, INCORPORATED, Gainesville, FL (US)

( * ) Notice: Subject to any disclaimer, the term of this patent is extended or adjusted under 35 U.S.C. 154(b) by 0 days.

(21) Appl. No.: 15/516,536

(22) PCT Filed: Oct. 2, 2015

(86) PCT No.: PCT/US2015/053784
§ 371 (c)(1),
(2) Date: Apr. 3, 2017

(87) PCT Pub. No.: WO2016/054545
PCT Pub. Date: Apr. 7, 2016

(65) Prior Publication Data
US 2017/0294528 A1    Oct. 12, 2017

Related U.S. Application Data

(60) Provisional application No. 62/058,942, filed on Oct. 2, 2014.

(51) Int. Cl.
*H01L 29/778* (2006.01)
*H01L 29/205* (2006.01)
(Continued)

(52) U.S. Cl.
CPC ........ *H01L 29/778* (2013.01); *H01L 29/0657* (2013.01); *H01L 29/2003* (2013.01);
(Continued)

(58) Field of Classification Search
CPC . H01L 29/778; H01L 29/205; H01L 29/0657; H01L 29/2003; H01L 29/4175;
(Continued)

(56) References Cited

U.S. PATENT DOCUMENTS 8,674,405 B1 * 3/2014 Babic ................ H01L 21/02458
257/183
2010/0012954 A1 * 1/2010 Yu .......................... H01L 33/382
257/88

(Continued)

OTHER PUBLICATIONS

International Search Report and Written Opinion, PCT/ISA/210, PCT/ISA/220, PCT/ISA/237, dated Dec. 28, 2015.

*Primary Examiner* — Fazli Erdem
(74) *Attorney, Agent, or Firm* — Alston & Bird LLP

(57) ABSTRACT

III-nitride based high electron mobility transistors (HEMTs), such as AlGaN/GaN HEMTs on Silicon substrates, with improved heat dissipation are described herein. A semiconductor device having improved heat dissipation may include a substrate having a top surface and a bottom surface, a nucleation layer on the top surface of the substrate, a transition layer on the nucleation layer, a buffer layer on the transition layer, a barrier layer on the buffer layer, and a metal layer filling a via hole that extends from the bottom surface of the substrate to a bottom surface of the transition layer.

19 Claims, 16 Drawing Sheets

(51) Int. Cl.
*H01L 29/417* (2006.01)
*H01L 29/66* (2006.01)
*H01L 29/06* (2006.01)
*H01L 29/20* (2006.01)
*H01L 23/36* (2006.01)

(52) U.S. Cl.
CPC ........ *H01L 29/205* (2013.01); *H01L 29/4175* (2013.01); *H01L 29/66462* (2013.01); *H01L 29/7786* (2013.01); *H01L 23/36* (2013.01); *H01L 29/41758* (2013.01); *H01L 2924/0002* (2013.01)

(58) Field of Classification Search
CPC ........... H01L 29/66462; H01L 29/7786; H01L 29/66
See application file for complete search history.

(56) References Cited

U.S. PATENT DOCUMENTS

| | | | |
|---|---|---|---|
| 2011/0140172 A1* | 6/2011 | Chu | H01L 29/2003 257/194 |
| 2012/0043586 A1* | 2/2012 | Nishimori | H01L 29/0657 257/194 |
| 2012/0211800 A1* | 8/2012 | Boutros | H01L 29/0657 257/194 |
| 2012/0326215 A1* | 12/2012 | Srivastava | H01L 29/0657 257/288 |
| 2013/0214281 A1 | 8/2013 | Li et al. | |
| 2013/0240898 A1* | 9/2013 | Briere | H01L 27/04 257/76 |
| 2014/0054604 A1* | 2/2014 | Ritenour | H01L 23/34 257/76 |
| 2014/0159049 A1* | 6/2014 | Ko | H01L 29/4175 257/76 |
| 2014/0209918 A1 | 7/2014 | Chen et al. | |
| 2014/0264361 A1 | 9/2014 | Chu et al. | |
| 2015/0056763 A1* | 2/2015 | Hobart | H01L 21/02115 438/172 |
| 2015/0099363 A1* | 4/2015 | Lin | H01L 29/2003 438/704 |
| 2015/0294921 A1* | 10/2015 | Viswanathan | H01L 23/367 257/76 |
| 2015/0340485 A1* | 11/2015 | Cheng | H01L 29/66522 257/76 |
| 2015/0364591 A1* | 12/2015 | Lu | H01L 29/66462 257/194 |
| 2017/0294528 A1* | 10/2017 | Ren | H01L 29/778 |

* cited by examiner

HIGH ELECTRON MOBILITY TRANSISTORS WITH IMPROVED HEAT DISSIPATION

CROSS-REFERENCE TO RELATED APPLICATIONS

This application is a national stage application of international Patent Application No. PCT/US2015/053784, filed Oct. 2, 2015, which claims the benefit of U.S. Provisional Application Ser. No. 62/058,942, filed Oct. 2, 2014, both of which are incorporated herein by reference in their entireties.

GOVERNMENT SUPPORT CLAUSE

This invention was made with government support under # HDTRA1-11-1-0020 awarded by DOD/DTRA. The government has certain rights in the invention.

BACKGROUND

A High Electron Mobility Transistor (HEMT) is a field-effect transistor incorporating a heterojunction between two materials with different energy bandgaps as the channel instead of a doped region. In particular, Aluminum gallium nitride/gallium nitride (AlGaN/GaN), indium aluminum nitride/GaN (InAlN/GaN) Al/GaN or AlGaN/InGaN/GaN based HEMTs have received increasing attention for high power and high frequency applications such as military radar and satellite-based communications systems, due to their superior mobility (~1400 cm2/V-s) and larger energy bandgap as compared to Si-based power transistors.

Regarding the GaN epi-layer, due to the lack of readily available, large-area GaN bulk materials, GaN epi-layers are usually grown on sapphire, silicon (Si) or silicon carbide (SiC) substrates. Among these substrates used for GaN epi-layers, sapphire is the most common one and is mainly used for GaN-based light emitting diode growth. However, the thermal conductivity of GaN is very poor, impacting the electronic device performance and reliability especially for high power applications. SiC substrates are an excellent choice for epitaxy growth owing to their high thermal conductivity and smaller lattice mismatch to GaN, but they are very expensive. Si is another common substrate because of the low cost, availability of large area wafers, relatively high thermal conductivity, and mature Si-based processing techniques. Recently, HEMT structures grown on 8-inch Si substrates have demonstrated that Si substrates are a prime candidate for commercialized, GaN mass-production applications. However, the large lattice mismatch between Si and GaN makes the nucleation interface layer become defective, requiring a thicker transition to grow good quality GaN epi-layers.

BRIEF SUMMARY

Techniques for improved heat dissipation of the HEMTs and the resultant HEMT structures are provided herein. Aspects of this disclosure describe a transistor and a method of fabrication for improving the heat dissipation within HEMTs. Advantageously, through using the described techniques the HEMT does not become over-heated in a high power and high frequency applications such as military radar and satellite-based communications systems.

A method for fabrication of a semiconductor device, such as a HEMT, having improved heat dissipation involves, after fabricating device layers of the HEMT on a substrate, etching a backside of the substrate to form a via hole through the substrate under a gate or active region of the HEMT and removing a nucleation layer exposed within the via hole so that a bottom surface of a transition layer is exposed. The method further involves filling the via hole with a metal, the metal in the via hole being aligned under the gate or active region of the HEMT with at least the transition layer, a buffer layer, and a barrier layer above the top surface of the metal in the via hole or blankly depositing the metal over the entire backside of the sample, including in the via hole. The metal can also be applied to the bottom of the substrate and further be connected to a source, drain, or gate electrode on the front side of the substrate.

A semiconductor device having improved heat dissipation may include a substrate having a top surface and a bottom surface, a nucleation layer grown on the top surface of the substrate, a transition layer on the nucleation layer, a buffer layer on the transition layer, a barrier layer on the buffer layer, and a metal layer filling a via hole that extends from the bottom surface of the substrate to a bottom surface of the transition layer. In some cases, the device may include a second metal-filled via-hole located under a source contact metal interconnect pad to form a backside source grounding. In some cases, the device may include a second metal-filled via-hole located under a gate connection pad to form a backside gate field plate.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Figure 1A:
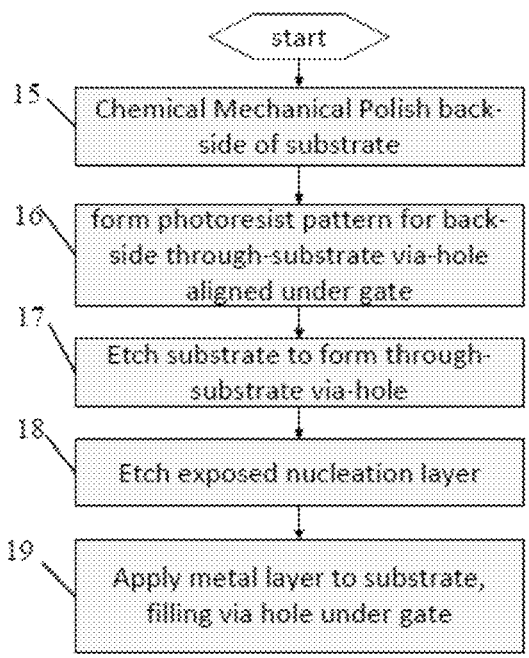
FIG. 1A illustrates an example process for fabricating an HEMT having improved heat dissipation.

Techniques for improved heat dissipation of the HEMTs and the resultant HEMT structures are provided herein. Inspection of the thermal response of HEMT/Si structures operated at high power density indicates how effectively they dissipate heat within the HEMT to enhance both device performance and improve the reliability. Although Si has a relatively high thermal conductivity as compared to sapphire, the nucleation interfacial defective layer between GaN and Si creates another non-negligible heat resistance. This thermally resistive nucleation layer (AlN) contains high densities of dislocations and impurities, which degrade device performance due to the self-heating effect induced by this defective interfacial layer.

Advantageously, by removing the nucleation layer that is directly under the gate region of the HEMT and filling the through-substrate backside via hole used to expose and remove the nucleation layer with metal, but leaving the other epitaxial layers of the HEMT (including a cap layer (0-15 nm), barrier layer (3-35 nm), channel layer (20-500 nm), buffer layer (0-4 μm) and transition layer (0-5 μm)) above the metal-filled via hole, heat dissipation can be significantly improved.

Specific examples for AlGaN/GaN HEMTs are described in detail herein. However, it should be understood that the described structures and techniques are also applicable to other material HEMTs in which a thermal resistance of a nucleation layer used to enable formation of the HEMT on a particular substrate is 3 to 9 times the thermal resistance contributed by the buffer layer material of the HEMT. For example, InAlN/GaN, AlN/GaN, AlGaN/AlN/GaN, AlGaN/AlN/InGaN/GaN or AlGaN/InGaN/GaN based HEMTs may be formed with a through-substrate backside via hole to remove defective and/or highly resistive layers.

Through studies provided in more detail herein, the highest temperature region of the HEMT was determined to be located at the device active area directly under the gate electrode(s). By forming the via-holes described herein, the thermally-resistive nucleation layer under the gate area is exposed and can be removed by etching. After removing this thermally resistive nucleation layer, the via-hole can be back-filled with plated metal to enhance the heat dissipation.

A through Si-substrate (or SiC) via-hole under the gate or the active area of GaN-based HEMTs grown on Si (or SiC) substrates is proposed to reduce the maximum junction temperature. By removing the highly thermally resistive nucleation layer and plating the via-hole with copper, the maximum junction temperature can be reduced from 146° C. to 120° C. at a power density of 5 W/mm. Besides reducing the maximum junction temperature of the HEMT, this through Si-substrate via-hole can be electrically connected to the source contact and act as a backside source (ground) field plate to reduce the maximum electric field around the gate edges and thereby increase the drain breakdown voltage. If this through Si-substrate via-hole is connected to the front gate pad, it can also behave as a back gate to improve front gate modulation.

In accordance with various embodiments, a metal-filled via-hole is formed under part of or the entirety of the gate region of the transistor. In some cases, the metal-filled via-hole can be formed under part of or entirely under the active region between the gate and the drain of the transistor.

A method for fabrication of a semiconductor device, such as a HEMT, having improved heat dissipation involves, after fabricating device layers of the HEMT on a substrate, etching a backside of the substrate to form a via hole through the substrate under a gate or active region of the HEMT and removing a nucleation layer exposed within the via hole so that a bottom surface of a transition layer is exposed. The method further involves filling the via hole with a metal, the metal in the via hole being aligned under the gate or active region of the HEMT with at least the transition layer, a buffer layer, and a barrier layer above the top surface of the metal in the via hole. The metal can also be applied to the bottom of the substrate and further be connected to a source, drain, or gate electrode on the front side of the substrate.

A semiconductor device having improved heat dissipation may include a substrate having a top surface and a bottom surface, a nucleation layer on the top surface of the substrate, a transition layer on the nucleation layer, a buffer layer on the transition layer, barrier layer on the buffer layer, and a metal layer filling a via hole that extends from the bottom surface of the substrate to a bottom surface of the transition layer.

Example Method of Fabrication for HEMT having Improved Heat Dissipation

Figure 2:
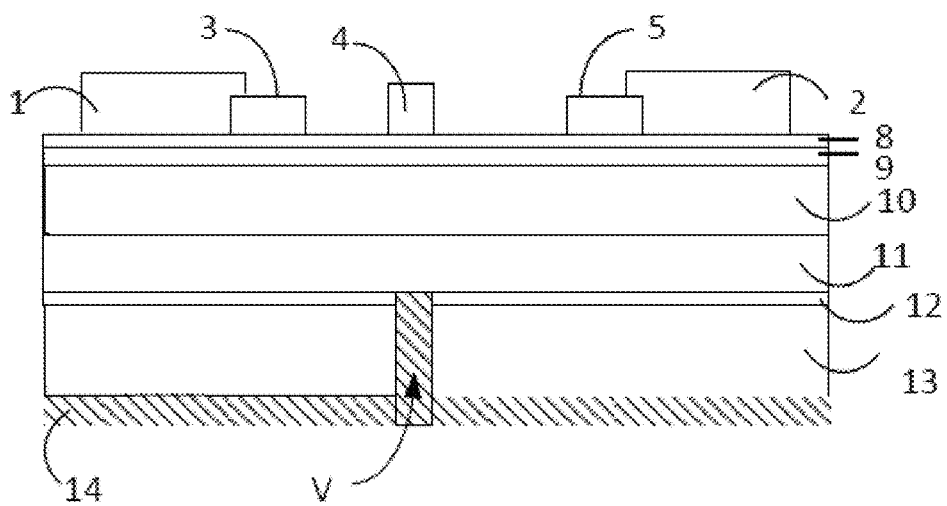
FIG. 2 shows an example cross-sectional view of a layer structure for an HEMT having improved heat dissipation.

FIG. 1A illustrates an example process for fabricating an HEMT having improved heat dissipation. FIG. 2 shows an example cross-sectional view of a layer structure for an HEMT having improved heat dissipation. The method illustrated in FIG. 1A begins after device layers such as gate 4 and gate connection pad (see e.g., element 6 of FIG. 3), source 3 and drain 5 (and corresponding metal interconnect 1, 2 for source and drain connection pads), an optional cap layer 8, a barrier layer 9, a buffer layer 10, a graded transition layer 11, and a nucleation layer 12 have been formed on a substrate 13. In some cases, other layers such as a designated channel layer may be included between the buffer layer and the barrier layer if the buffer layer is doped to compensate the background doping (e.g., if these is a carbon, iron, or chromium dopant in a GaN buffer layer, then an undoped GaN channel layer is grown on the buffer layer). In one implementation of an AlGaN/GaN HEMT structure, a thin AlN layer may be disposed between a GaN channel layer and an AlGaN barrier layer to reduce the roughness of the heterojunction interface.

Returning to FIG. 1A, in step 15, the substrate 13 of the HEMT may be polished using a chemical mechanical polish (CMP), a regular polish, or an etching process to reduce the thickness of the substrate and to obtain a desired final thickness. For example, a Si substrate that is originally 300 µm to 1 mm may be reduced to a suitable thickness of about 50-300 µm. Next, photolithography (in step 16) can be performed to form a photoresist pattern for via holes at the backside of the substrate 13. A via-hole may be etched into the substrate 13 under the gate region or active region using the photoresist pattern as an etch mask (in step 17). The etching may be implemented using a deep reactive ion etching (DRIE) process such as the BOSCH etching process. The nucleation layer exposed through the via-hole of the substrate may be etched away in step 18. The photoresist may be removed before or after the etching of the nucleation layer depending on implementation. Finally, a metal layer 14 may be applied to the bottom surface of the substrate filling the via-hole (in step 19). The metal layer can be, for example, titanium, gold, tungsten, silver, copper, other refractory metal (e.g., V, Cr, Zr, Hf, Ta, Re, Os, Ir, Ru, Rh) or a combination thereof.

Accordingly, as shown in FIG. 2, the resulting structure includes a metal-filled via hole V aligned under the gate 4 so that all or at least a portion of the metal-filled via hole V is directly below the gate 4. In some cases, the metal-filled via hole V may be offset so that the metal-filled via hole V is disposed under the region between the gate 4 and the drain 5. In a specific implementation, the via-hole extends from the bottom of substrate 13 through nucleation layer 12 and abuts the bottom surface of transition layer 11. In some cases, a portion of the transition layer or the complete transition layer 11 may be removed; however, a sufficiently thick part of the transition layer should remain above the via hole (e.g., to provide device layers of at least about 0.1-1.5 µm so as to minimize parasitic capacitance due to the metal 14 being directly below the gate 4). An example of an embodiment for an AlGaN/GaN HEMT may comprise a GaN cap layer 8, an AlGaN barrier layer 9, a GaN buffer layer 10, an AlGaN graded transition layer 11, and an AlN nucleation layer on a Si substrate 13. In the illustrated implementation, the GaN cap layer 8 is about 2.5 nm, the AlGaN barrier layer 9 is about 25 nm, the GaN buffer layer 10 is about 0.8 µm, and the AlGaN graded transition layer 11 is about 1 to 2 µm.

Example Method of Fabrication for HEMT Including a Backside Source Field Plate

Figure 1B:
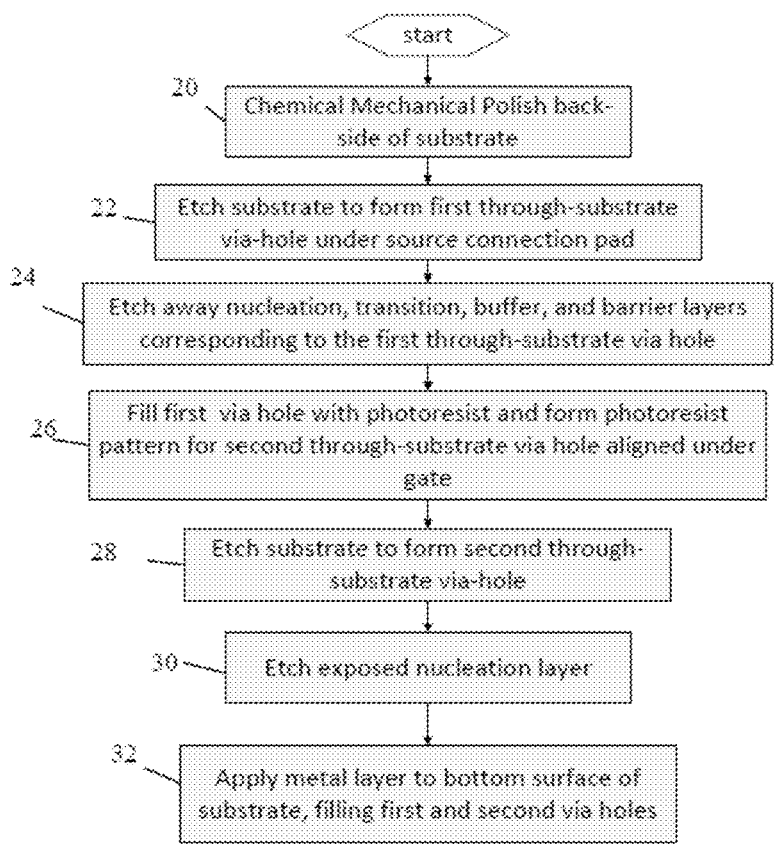
FIG. 1B illustrates an example process for fabricating an HEMT having a backside source field plate.
Figure 3:
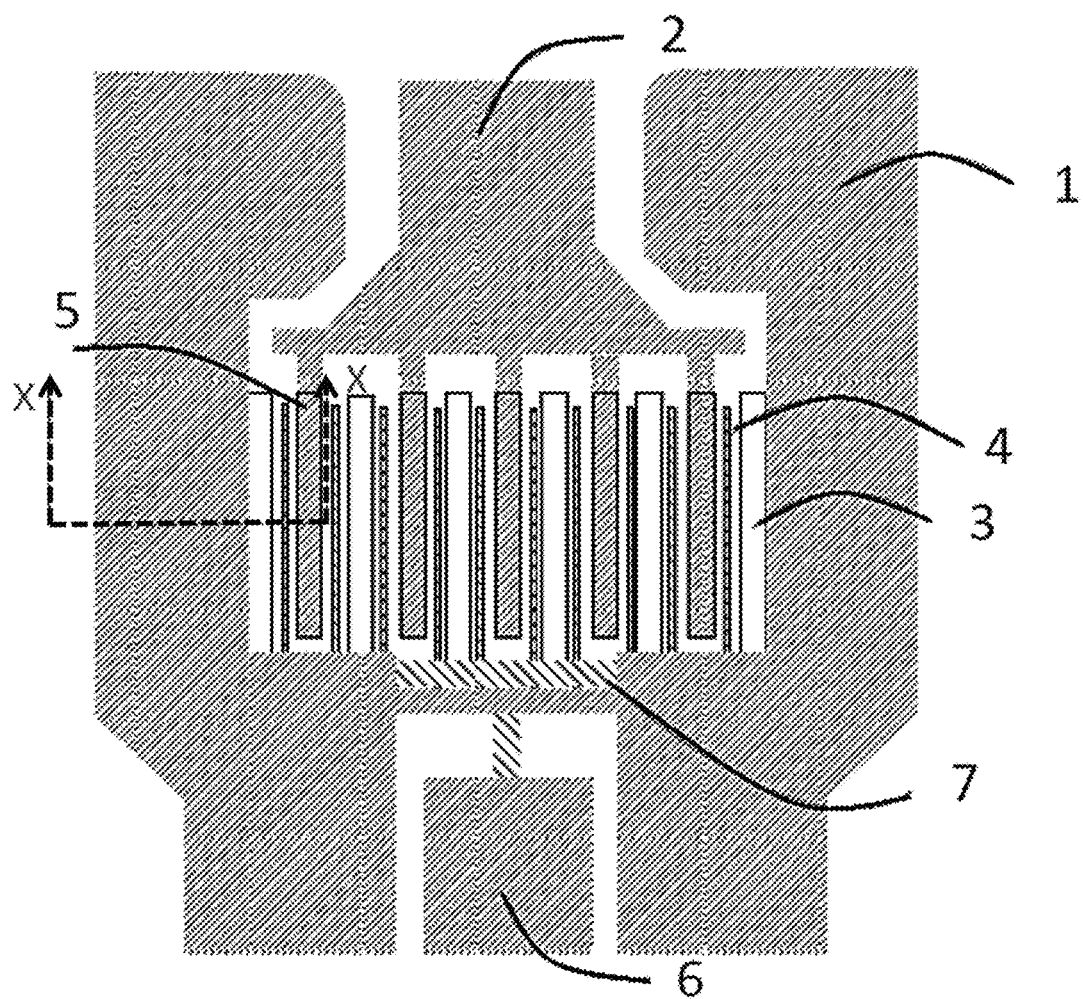
FIG. 3 illustrates an example top plan view of an HEMT that may have a backside source field plate.

FIG. 1B illustrates an example process for fabricating an HEMT having a backside source field plate. FIG. 3 illustrates an example top plan view of an HEMT that may have a backside source field plate; and FIGS. 4-10 illustrate cross-sectional views of a layer structure along line X-X of FIG. 3 corresponding to each step of the method illustrated in FIG. 1B. In FIG. 3, reference character 7 represents a gate air bridge (e.g., of about 300 nm for an implementation where source, gate, and drain connection pads 1, 6, and 2 are about 300 nm and source 3, gate 4, and drain 5 metal are about 100 nm). The backside source field plate can provide backside source grounding.

Figure 4:
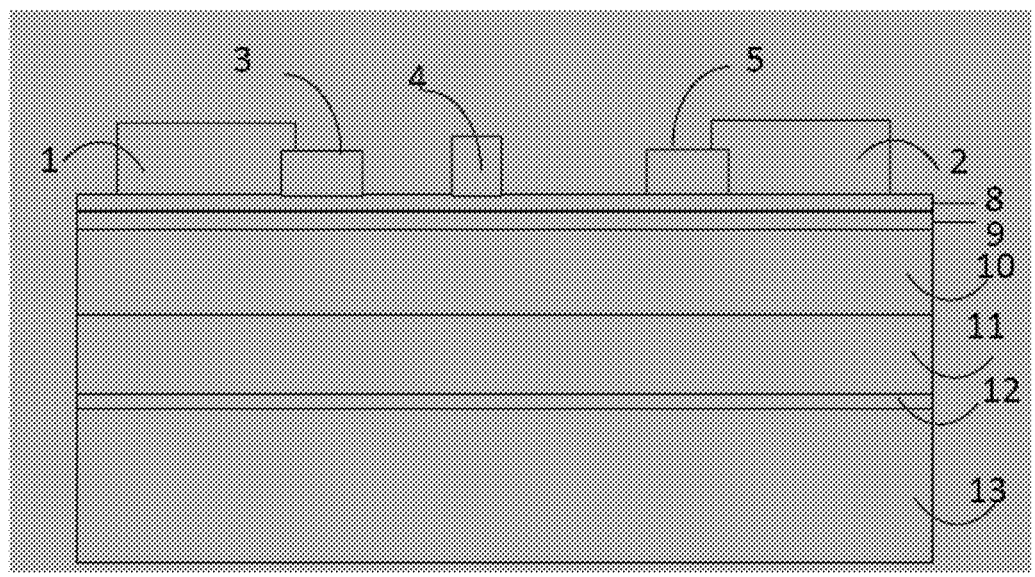
FIGS. 4-10 are cross-sectional views along line X-X of FIG. 3, illustrating a fabrication process such as described with respect to FIG. 1B.
Figure 5:
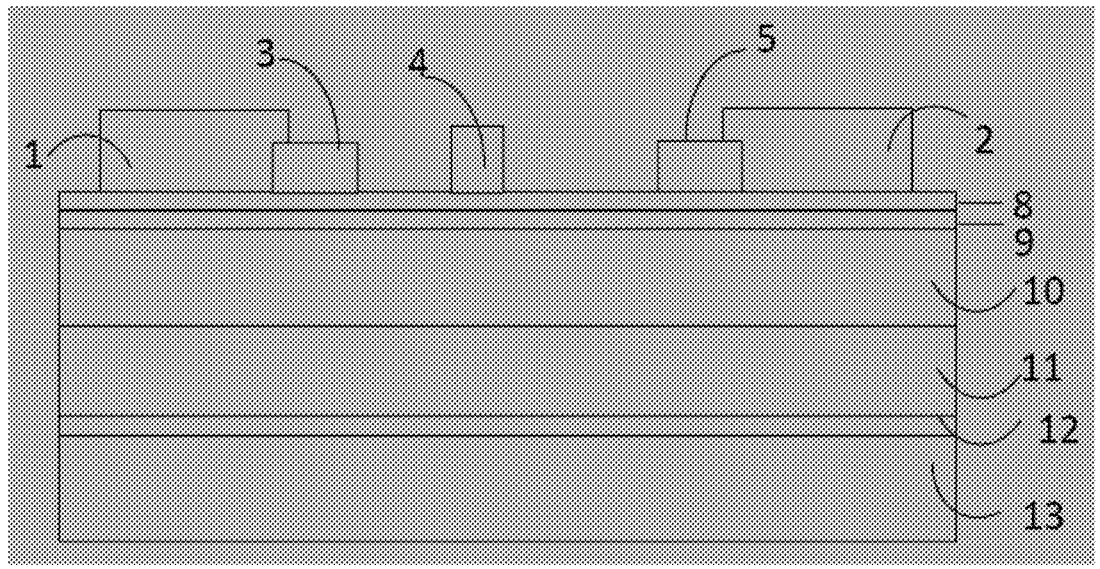
Figure 6:
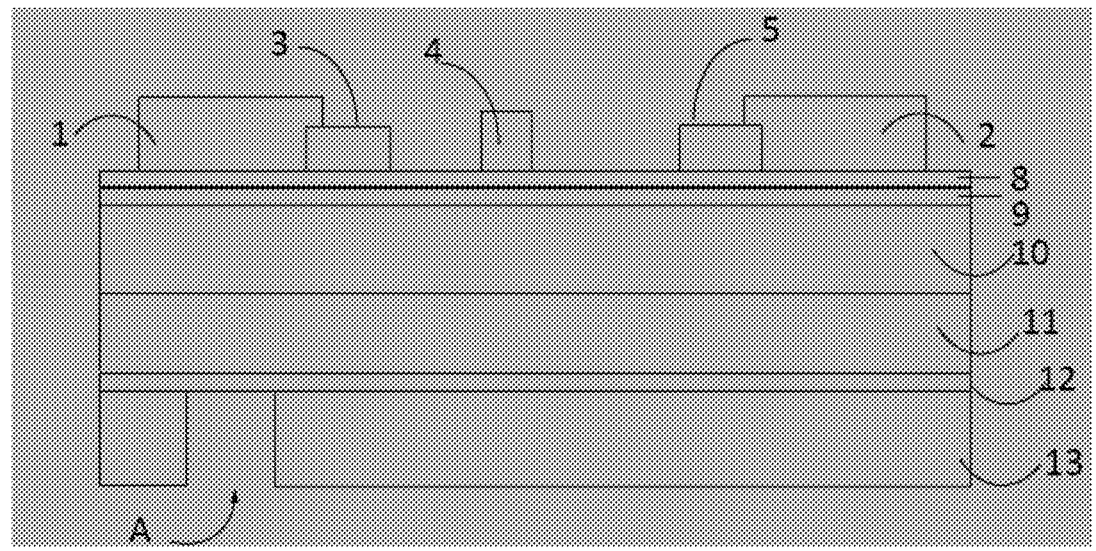
Figure 7:
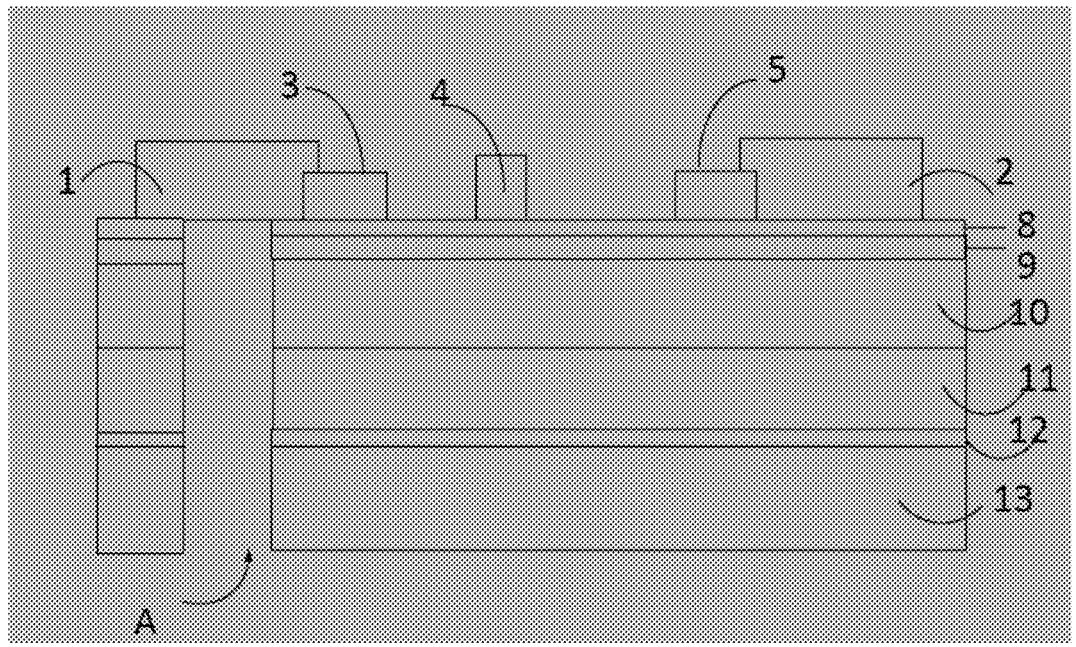

Before the process of FIG. 1B begins, an HEMT may be formed on a substrate as illustrated in the layer structure of FIG. 4. Then, in step 20, the substrate 13 of the HEMT shown in FIG. 4 may be polished using a CMP process to reduce the thickness of the substrate, for example from the original range of 300 µm-1 mm to a thickness of about 200 µm, the reduced substrate thickness represented by the layer structure shown in FIG. 5. As illustrated in FIGS. 6 and 7, a source-contacting via hole A can be formed by etching the substrate 13 (step 22), for example through a BOSCH etching process, and then etching the nucleation 12, transition 11, buffer 10, barrier 9 and cap 8 layers (step 24) to expose the underside of the source connection pad 1.

Figure 8:
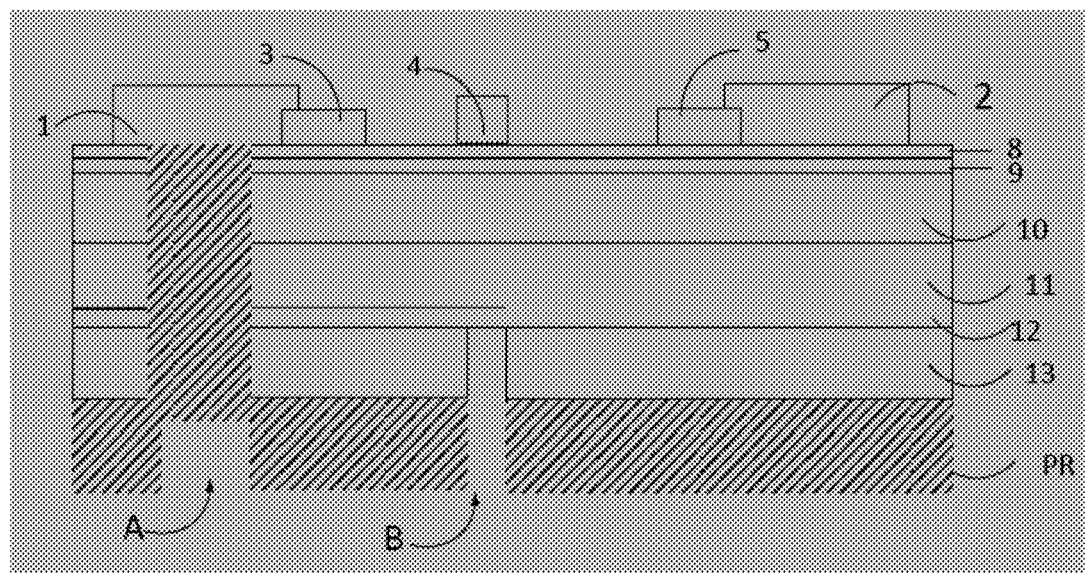
Figure 9:
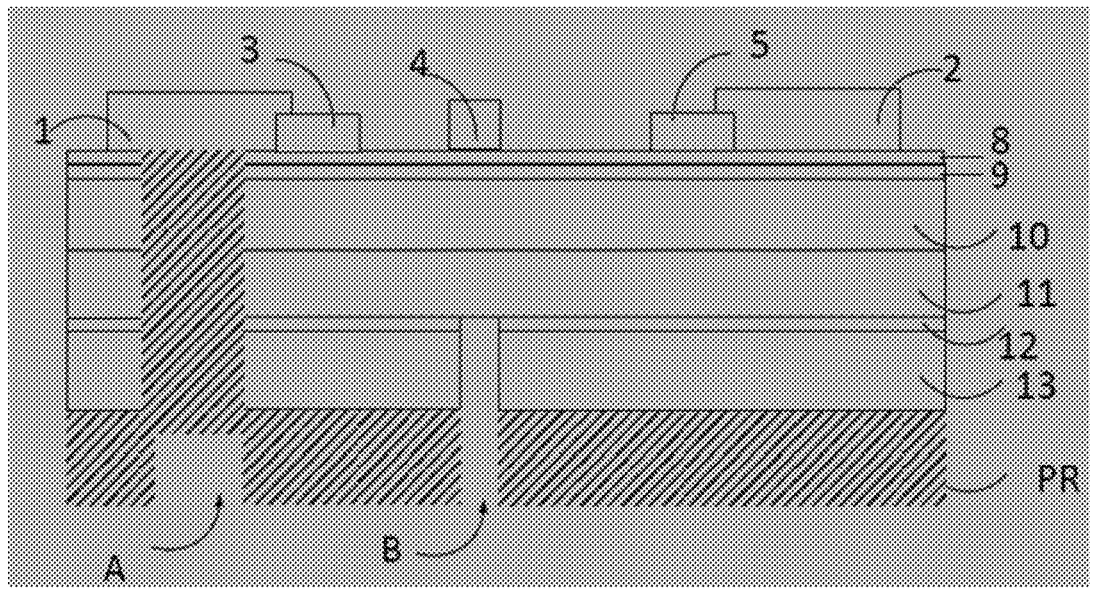
Figure 10:
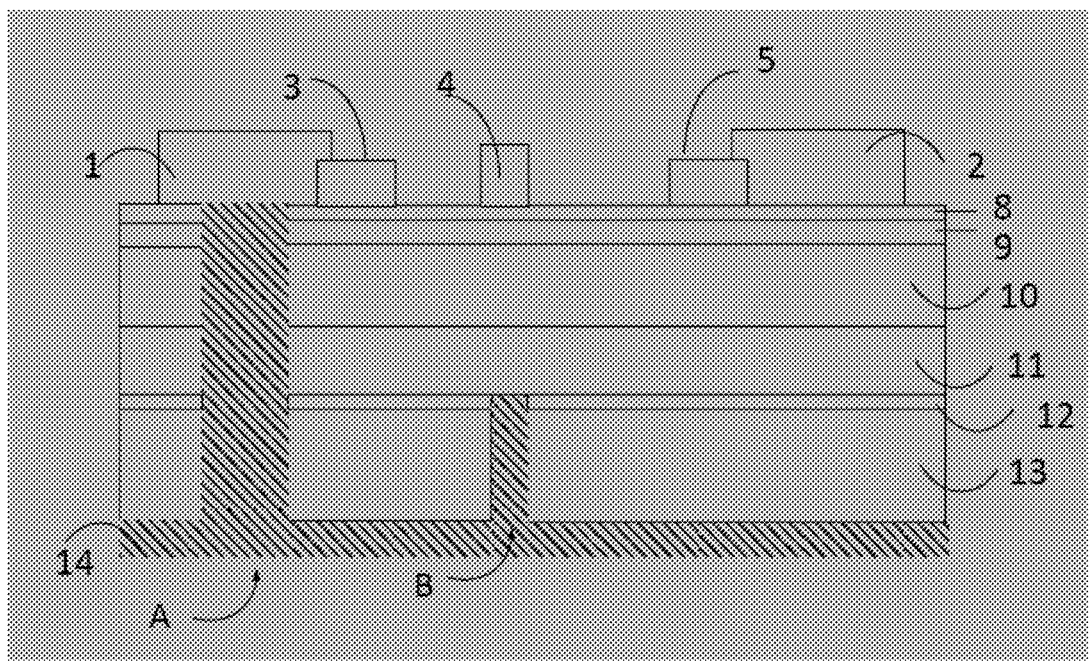

Next, in step 26, a photoresist layer can be applied and a photolithography process performed to form a photoresist pattern PR where the source-contacting via hole A is filled with the photoresist layer and the substrate is exposed for a second through-substrate via hole aligned under the gate 4. As described above, in some implementations, the alignment is directly under the gate 4. In some implementations, the alignment is at least partially directly under the gate 4; and in some implementations, the alignment is between the gate 4 and the drain 5. Returning to FIG. 1B and as illustrated in FIG. 8, the substrate 13 may be etched for the second via hole B using the photoresist pattern PR as an etch mask (step 28). The etching may be implemented using BOSCH etching. The via-hole B may be completed by etching the exposed nucleation layer 12 (step 30) as shown FIG. 9. After removing the photoresist PR, a metal layer 14 may be applied to the bottom surface of the substrate 13 filling both via-holes A and B (step 32). As illustrated in FIG. 10, the metal-filled via holes A and B are connected by the metal layer and provide a combination backside source field plate and heat sink.

Example Method of Fabrication for HEMT Including a Backside Gate Field Plate

Figure 1C:
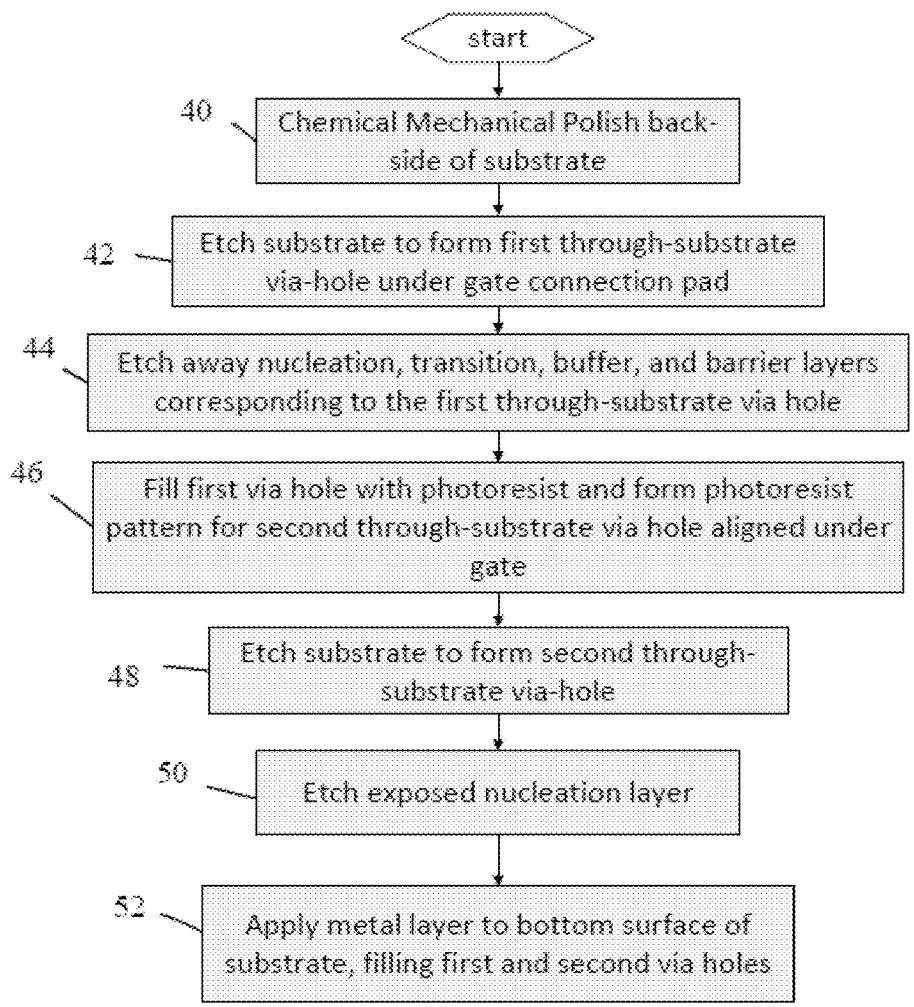
FIG. 1C illustrates an example process for fabricating an HEMT having a backside gate field plate.
Figure 11:
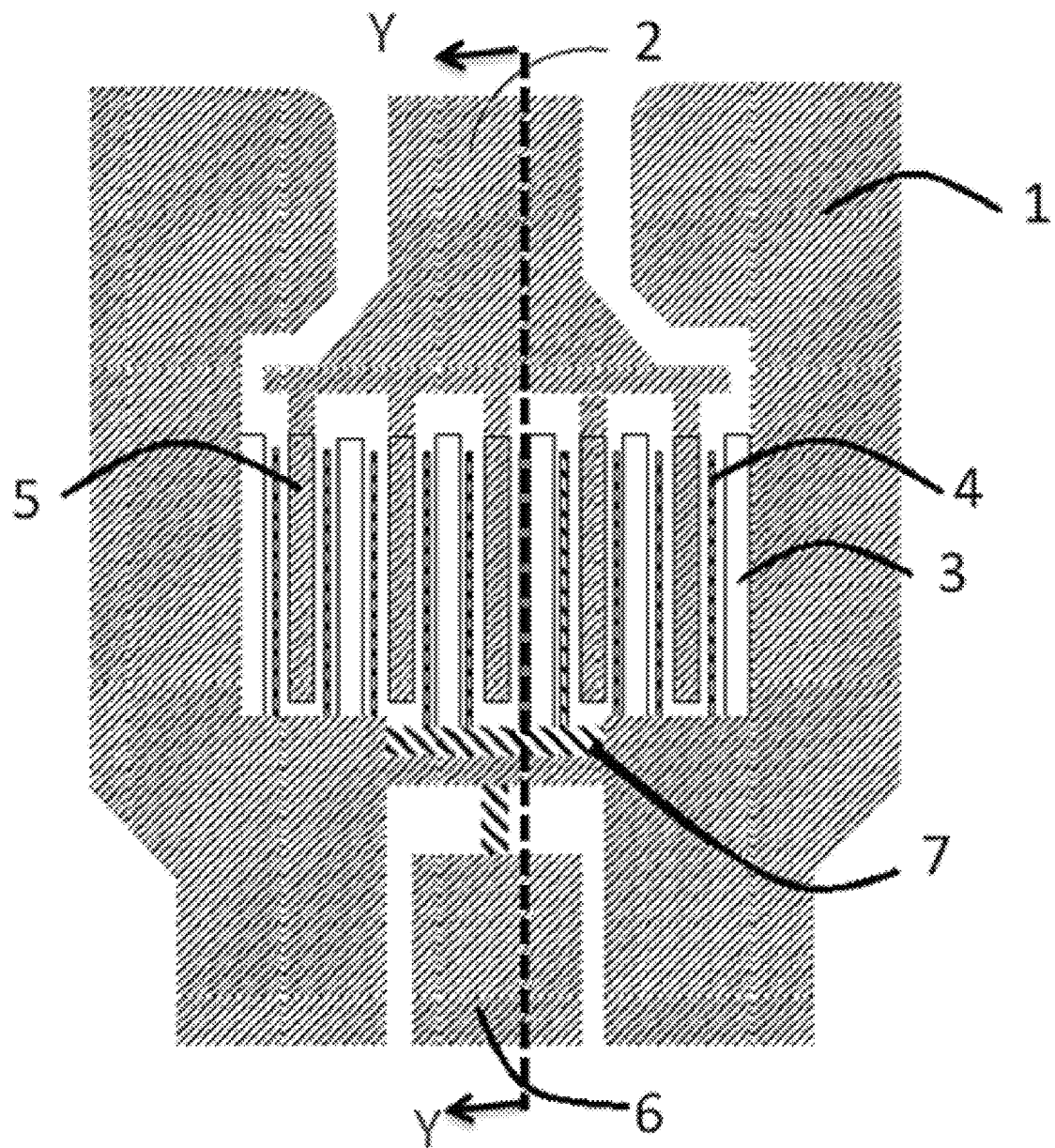
FIG. 11 illustrates an example top plan view of an HEMT that may have a backside gate field plate.

FIG. 1C illustrates an example process for fabricating an HEMT having a backside gate field plate. FIG. 11 illustrates an example top plan view of an HEM that may have a backside gate field plate; and FIGS. 12-18 illustrate cross-sectional views of a layer structure along Y-Y of FIG. 11 corresponding to each step of the method illustrated in FIG. 1C. In FIGS. 11-18, reference character 7 represents a gate air bridge (e.g., of about 300 nm for an implementation where source, gate, and drain connection pads 1, 6, and 2 are about 300 nm and source 3, gate 4, and drain 5 metal are about 100 nm).

Figure 12:
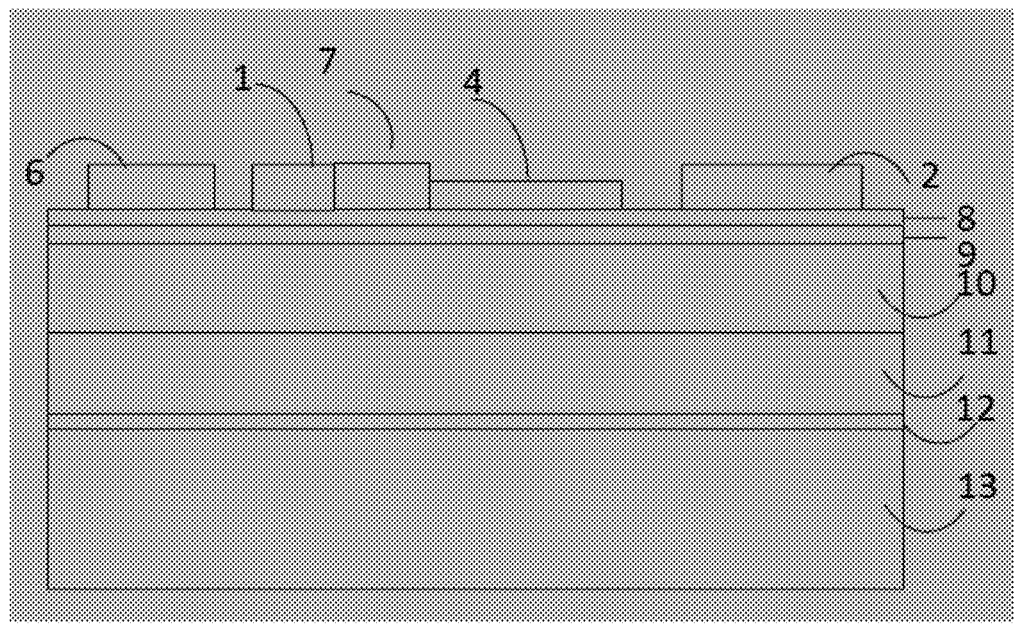
FIGS. 12-18 are cross-sectional views along line Y-Y of FIG. 11, illustrating a fabrication process such as described with respect to FIG. 1C.
Figure 13:
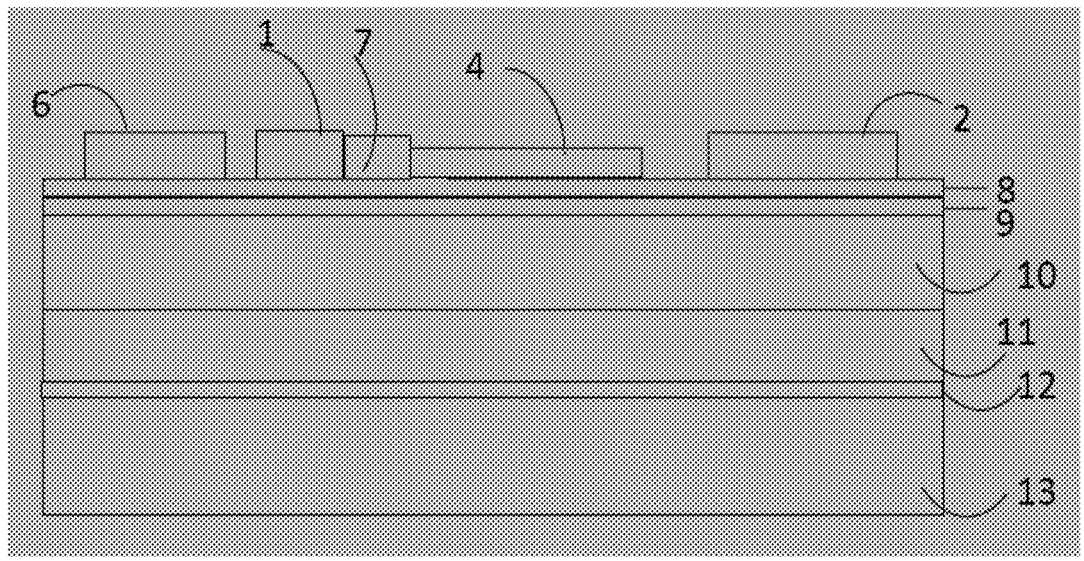
Figure 14:
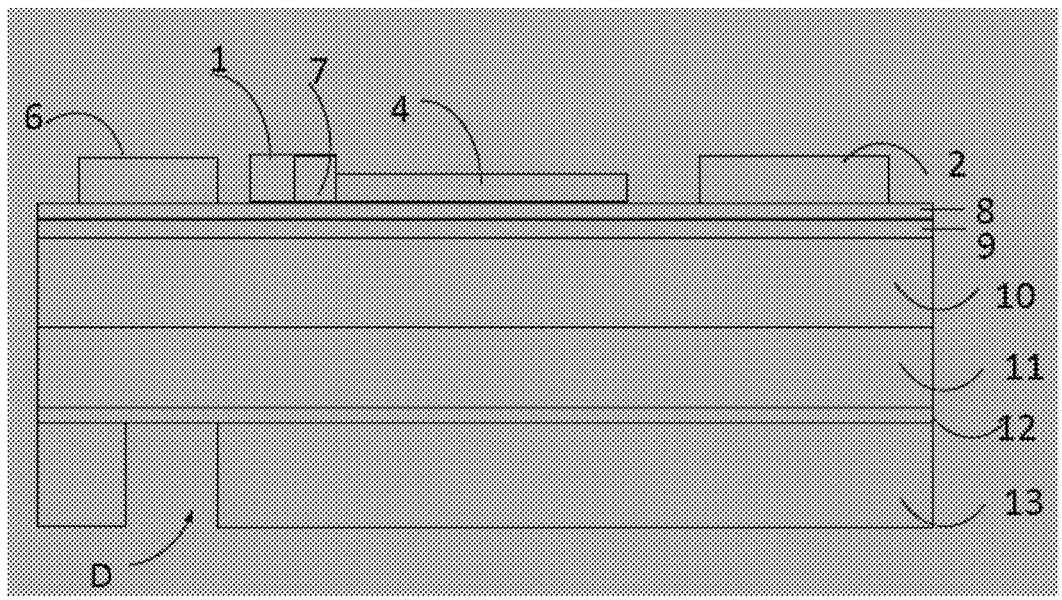
Figure 15:
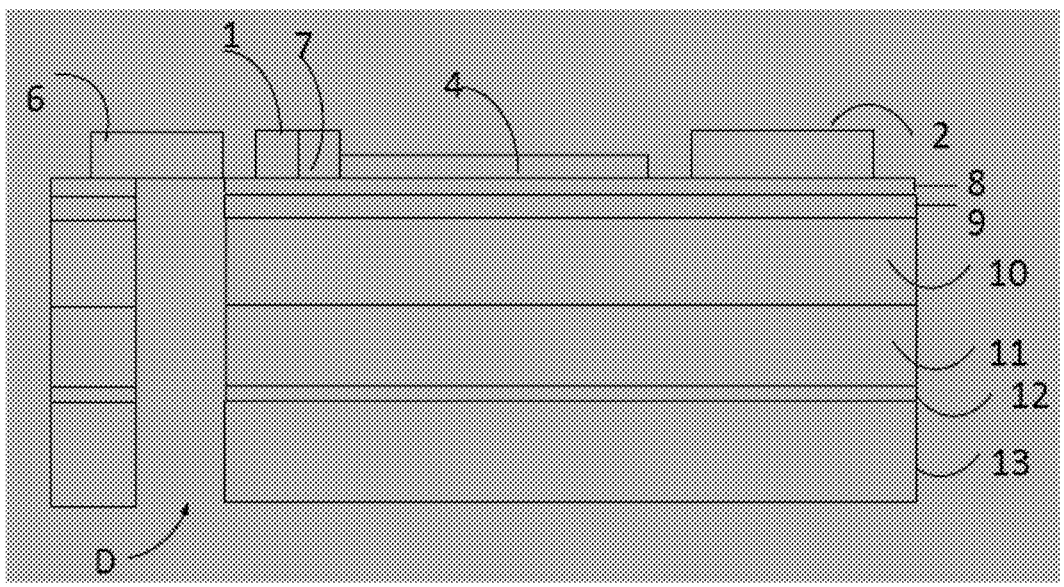

Before the process of FIG. 1C begins, an HEMT may be formed on a substrate as illustrated in the layer structure of FIG. 12 Then, in step 40, the substrate 13 of the HEMT shown in FIG. 12 may be polished using a CMP process to reduce the thickness of the substrate, for example, from the original range of 300 µm-1 mm to a thickness of about 200 µm, the reduced substrate thickness represented by the layer structure shown in FIG. 13. As illustrated in FIGS. 14 and 15, a gate-contacting via hole D can be formed by etching the substrate 13 (step 42), for example through a BOSCH etching process, and then etching the nucleation 12, transition 11, buffer 10, barrier 9 and cap 8 layers (step 44) to expose the underside of the gate connection pad 6.

Figure 16:
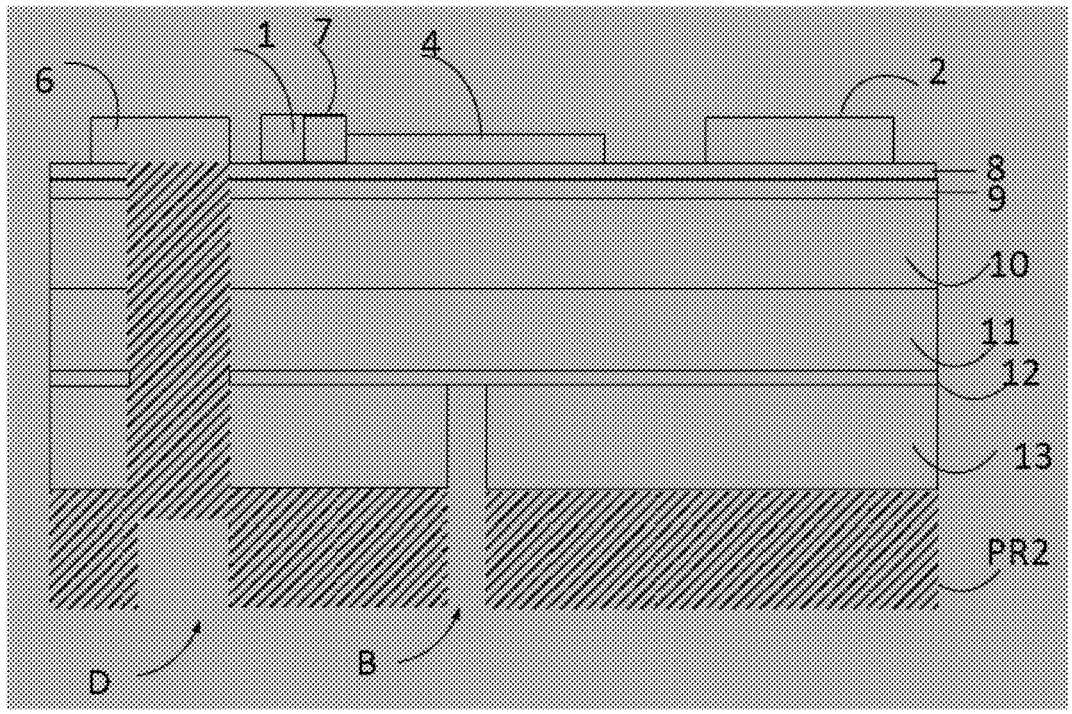
Figure 17:
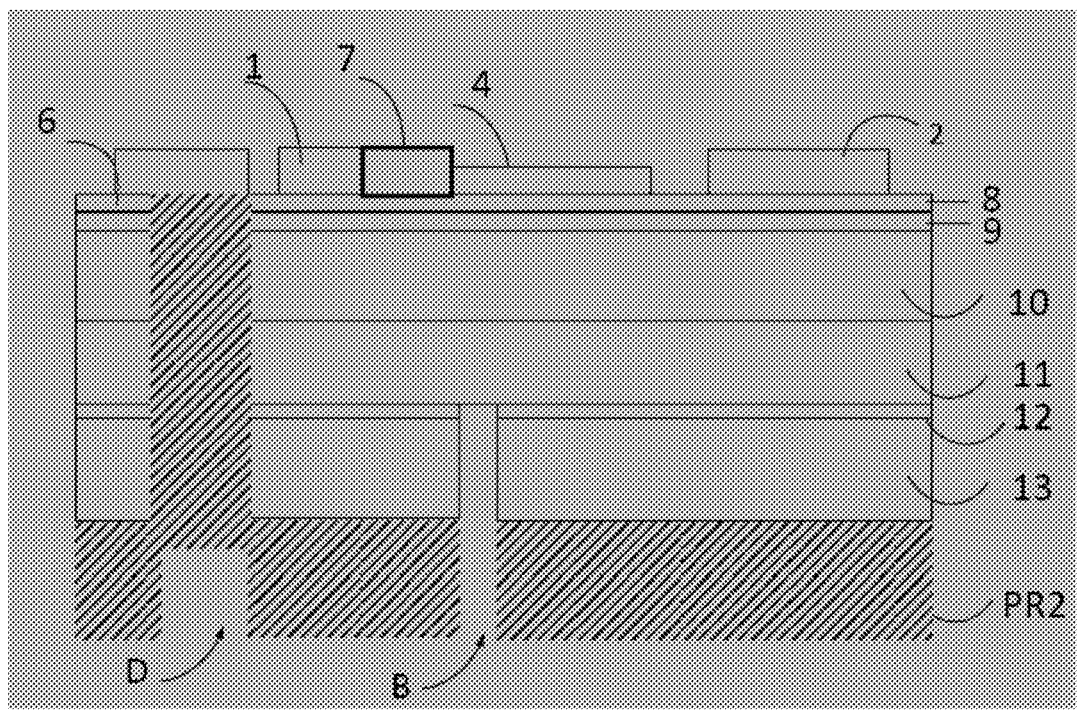
Figure 18:
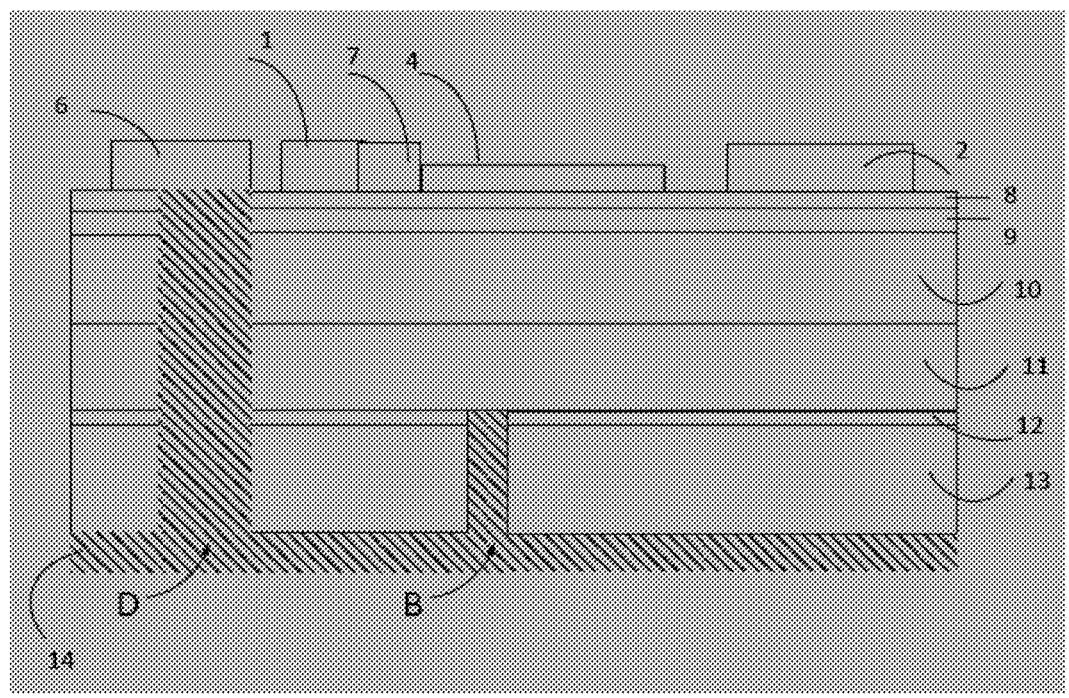

Next, in step 46, a layer of photoresist may be applied to the bottom surface of the substrate 13 and a photolithography process performed to form a photoresist pattern PR2, where the gate-contacting via hole D is filled with the photoresist and the substrate is exposed for a second through-substrate via hole aligned under the gate 4. As described above, in some implementations, the alignment is directly under the gate 4. In some implementations, the alignment is at least partially directly under the gate 4; and in some implementations, the alignment is between the gate 4 and the drain 5. Returning to FIG. 1C and as shown in FIG. 16, the substrate 13 may be etched for the second via-hole B using the photoresist pattern PR2 as an etch mask (step 48). The etching may implemented using BOSCH etching. The via hole B may be completed by etching the exposed nucleation layer 12 (step 50) as shown FIG. 17. After removing the photoresist PR2, a metal layer 14 may be applied to the bottom surface of the substrate 13 filling both via-holes D and B (step 52). As illustrated in FIG. 18, the metal filled via holes D and B are connected by the metal layer 14 and provide a combination backside gate field plate and heat sink.

Studies

Figure 19:
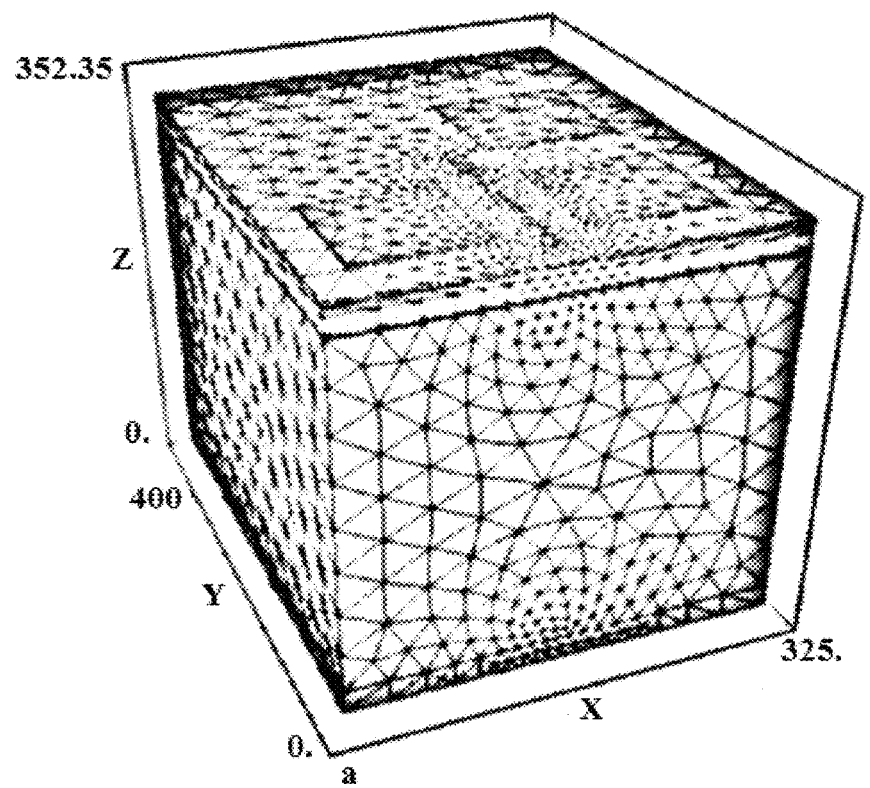
FIG. 19 shows a 3-D mesh structure of the AlGaN/GaN HEMT used in the finite element simulation. The structure is composed of 4×106 tetrahedra and 8×106 grid points.
Figure 20:
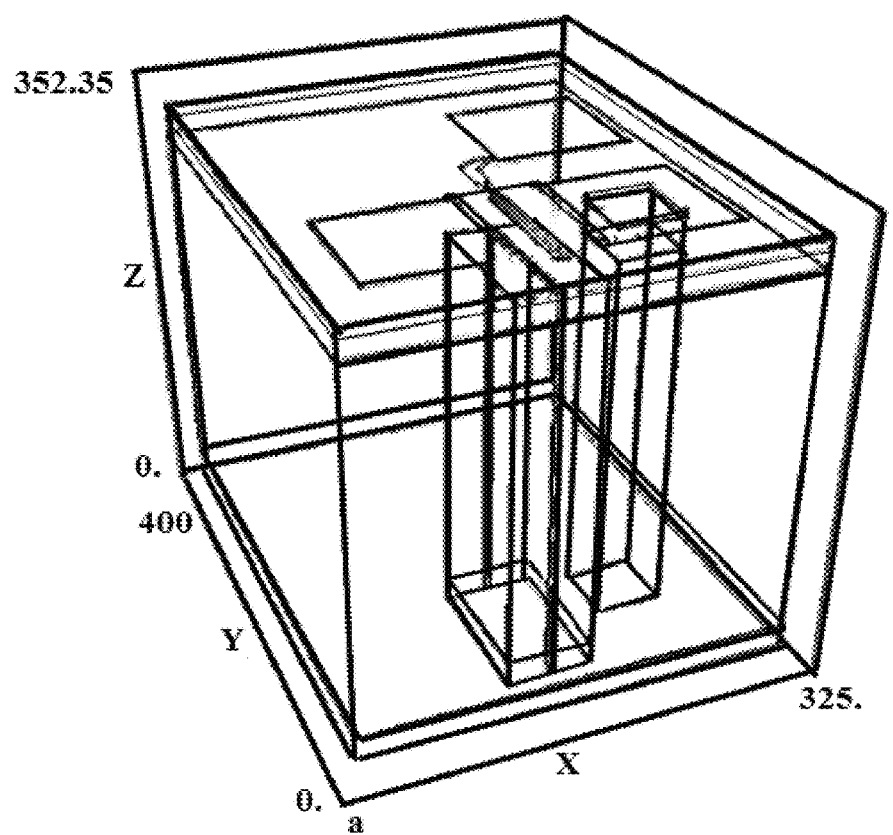
FIG. 20 illustrates a 3-D frame structure with a source contact through-wafer via-hole and through Si substrate via-hole under the active area of the HEMT.

FIG. 19 shows 3-D mesh structure of the AlGaN/GaN HEMT used in a finite element simulation, where the structure is composed of 4×106 tetrahedra and 8×106 grid points. Additionally, FIG. 20 illustrates a 3-D frame structure with a source contact through-wafer via-hole and through Si substrate via-hole under the active area of the HEMT. Specifically, simulation results may be generated with 4×106 tetrahedra and 8×106 grid points, and the mesh density may be adjusted depending on the magnitude of temperature gradient. The HEMT structure used in the modeling shown in FIG. 19 consists of a 25 nm AlGaN barrier layer, a 0.8 μm GaN buffer layer, a 1.4 μm AlGaN transition layer and 28 nm AlN nucleation layer on 100 μm thickness Si substrate. The dimensions of the Ohmic contacts were 30 μm×100 μm, and the source to drain distance was 4 μm. The gate length and width were 0.45 and 100 μm, respectively. A square through wafer via-hole of 50 μm×50 μm was placed under the source contact pad. A rectangular through Si substrate via-hole of 6 μm (1 μm of Ohmic contact transfer length on each side of source and drain contact plus the space between source and drain contacts of 4 μm)×110 μm was configured beneath the HEMT active area. Both via-holes were filled with copper. The thermal resistances for each layer used in the HEMT structure are listed in Table I.

TABLE I

Material Thermal Properties

| Material | Thermal Conductivity (W/m-K) |
|---|---|
| Cu | 401 |
| Si | 149 |
| AlN defective layer | 0.538 |
| AlGaN | 25 @ 300 K |
| GaN | 130 @ 300 K |
| Ohmic metal | 200 |
| Metal contact | 381 |
| Gate metal | 381 |
| SiN | 30 |

The model used for the thermal simulation may be based upon the steady state energy $$k\left(\frac{\partial^2 T}{\partial x^2} + \frac{\partial^2 T}{\partial y^2} + \frac{\partial^2 T}{\partial z^2}\right) = P_D \quad (1)$$

balance of the 3-D unit chip using rectangular coordinates (x-, y- and z-axes).

where k is the thermal conductivity in units W/m-K, T is the temperature and PD is the heat source density in W/m3. A boundary condition was set with a temperature of 300 K at the bottom of the Si substrate.

Figure 21:
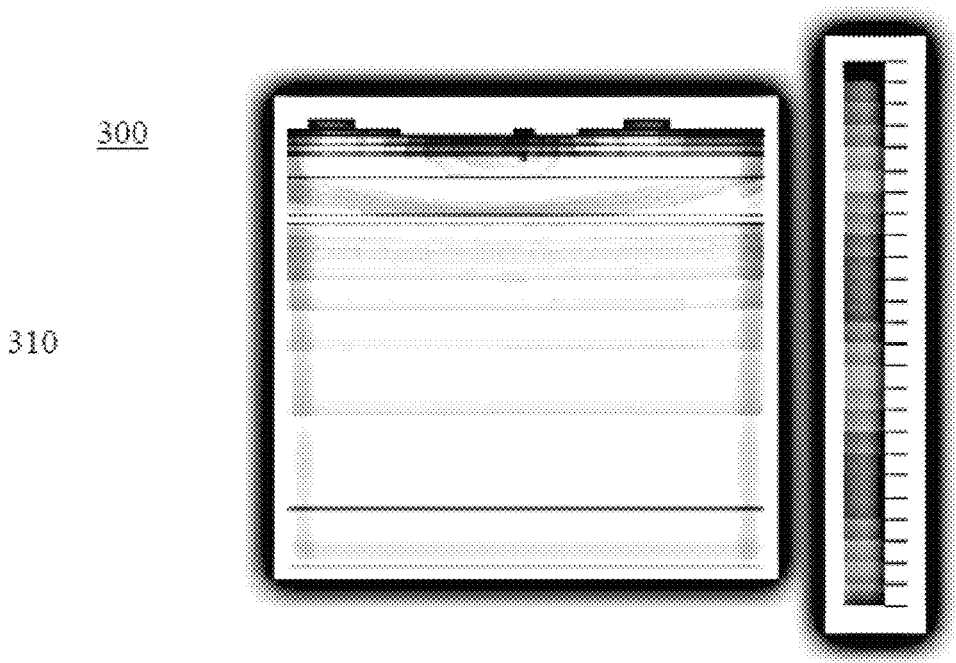
FIG. 21 displays cross-sectional temperature contours of the reference HEMT with a through-wafer source-contact via-hole.
Figure 22:
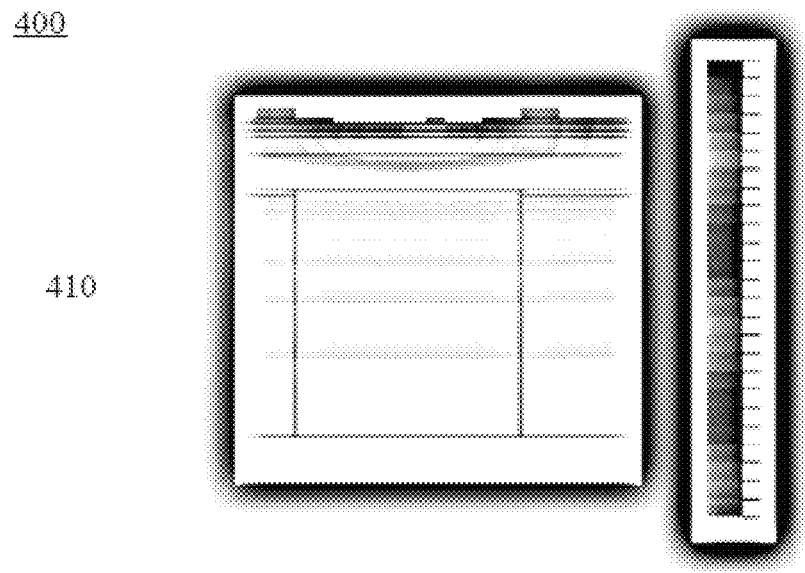
FIG. 22 displays cross-sectional temperature contours of the HEMT with a through-wafer source-contact via-hole and an additional through Si-substrate via-hole under the active area filled with copper. The power density used in both simulations was 5 W/mm.

FIG. 21 displays cross-sectional temperature contours of the reference HEMT with a through-wafer source-contact via-hole. FIG. 22 displays cross-sectional temperature contours of the HEMT with a through-wafer source-contact via-hole and an additional through Si-substrate via-hole under the active area filled with copper. The power density used in both simulations was 5 W/mm. For the reference HEMT, the simulated maximum junction temperature was 146° C., while the maximum junction temperature of the HEMT with additional Cu-filled Si-substrate via-hole under the device active area was 120° C. The reduction of the maximum junction temperature for the HEMT with additional Cu-filled Si-substrate via-hole under the device active area may be achieved by removing the highly defective and thermally resistive nucleation layer under the device active area, as well as filling the through Si-substrate via-hole with thermally conductive copper. To evaluate the effectiveness of thermal dissipation, absolute thermal resistance, R, is typically used, which is defined as $$R = \Delta T/W \quad (2)$$

where ΔT is TJ–TS, TJ is the maximum junction temperature, TS is the temperature of the heat sink and W is the total power dissipated by the device in Watts.

To study the effects of the defective nucleation layer and copper filled through Si-substrate via-hole on the absolute thermal resistance and maximum junction temperature, the temperature distributions of the devices with and without the removal of defective AlN nucleation layer as well as the devices with through Si-substrate via-hole filled with Cu may be simulated. The maximum junction temperature and absolute thermal resistance for different conditions are presented in Table II and the nucleation layer exhibited the lowest thermal conductivity among all the layers. In other words, the total thermal resistance may be reduced 14% if the nucleation layer was etched off. On the other sides, the difference of the absolute thermal resistance between the device with and without the copper filled through-Si substrate via-hole under the active area of the device was around 10 K/W. Thus the combination of the removal of the nucleation layer and the implementation of the copper filled via-hole provided may be comprise of a reduction of 17% of the total thermal resistance of the device.

TABLE II

Absolute Thermal Resistance of HEMT with Different Configurations

| Type of HEMT | Reference HEMT | HEMT I | Proposed HEMT |
|---|---|---|---|
| Source via | Cu filled | Cu filled | Cu filled |
| Si via | no | yes | yes |
| Removal of AlN defective layer | no | no | yes |
| Maximum junction temperature at 5 W/mm (° C.) | 146 | 140 | 120 |
| Absolute heat resistance [K/W] | 290 | 280 | 240 |
| Percentage change (%) | — | −3.45 | −17.24 |

Figure 23:
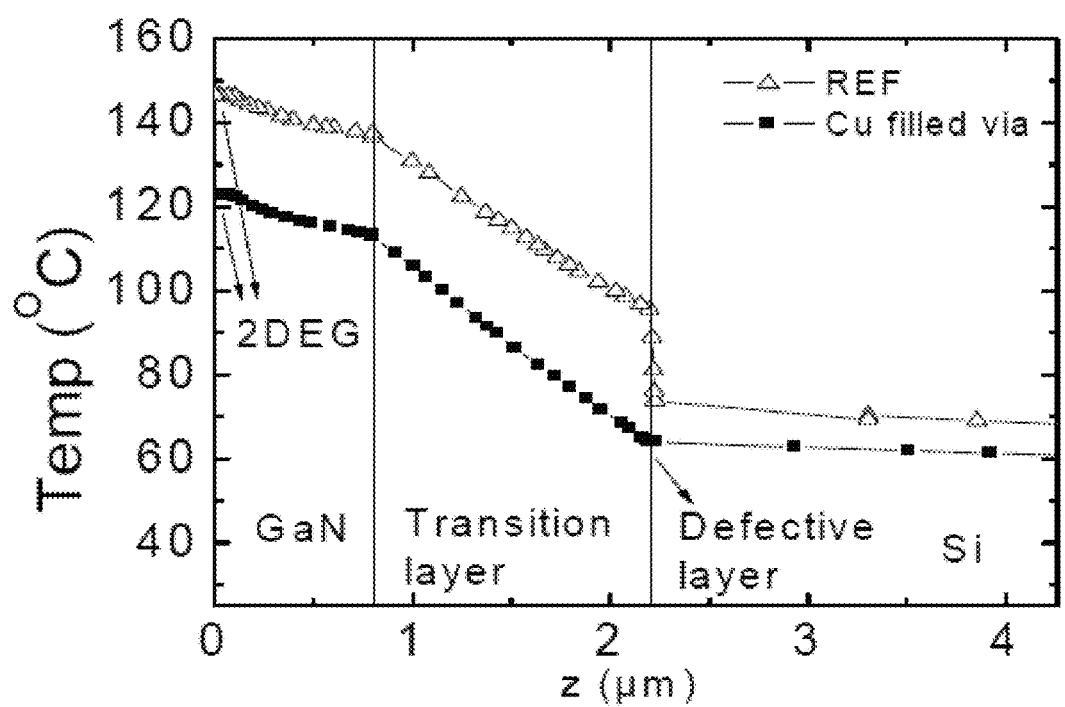
FIG. 23 illustrates vertical temperature distributions across epitaxial layers directly under the gate finger for the reference HEMT with a through-wafer source-contact via-hole and the HEMT with both a through-wafer source-contact via-hole and an additional through Si-substrate via-hole under the active area filled with copper.

FIG. 23 shows vertical temperature distributions across epitaxial layers directly under the gate finger for the reference HEMT with a through-wafer source-contact via-hole and the HEMT with both a through-wafer source-contact via-hole and an additional through Si-substrate via-hole under the active area filled with copper. The dimensions of the top AlGaN layer and 2DEG channel may be too thin and the temperature changes across these regions may also be too small to be observed in FIG. 23. For the reference sample, the temperature may drop across the GaN buffer layer, AlGaN transition layer and AlN nucleation layer by 9° C., 64° C., and 6° C., respectively. The thermal conductivity of the 800 nm GaN buffer layer may be 130 W/K-m, which is around 6 times larger than the thermal conductivity of the 1.4 µm AlGaN transition layer, 25 W/K-m. Thus, the temperature drop in the AlGaN transition layer may around 6 times larger than the one simulated in the GaN buffer layer. Although the thickness of the very defective AlN nucleation may be only 28 nm, there is an obvious 6° C. temperature drop in this example due to its very high thermal resistivity, as shown in FIG. 23. In the case where the defective AlN nucleation layer under the active layer of the HEMT with the through Si via-hole was removed and the via-hole was filled up with plated copper, not only may the junction temperature be much lower than the reference HEMT, but also the temperature at the bottom of the AlGaN transition layer may be around 10° C. lower than that of the reference HEMT. This indicates the effectiveness of heat removal from the copper filled via-hole.

Figure 24:
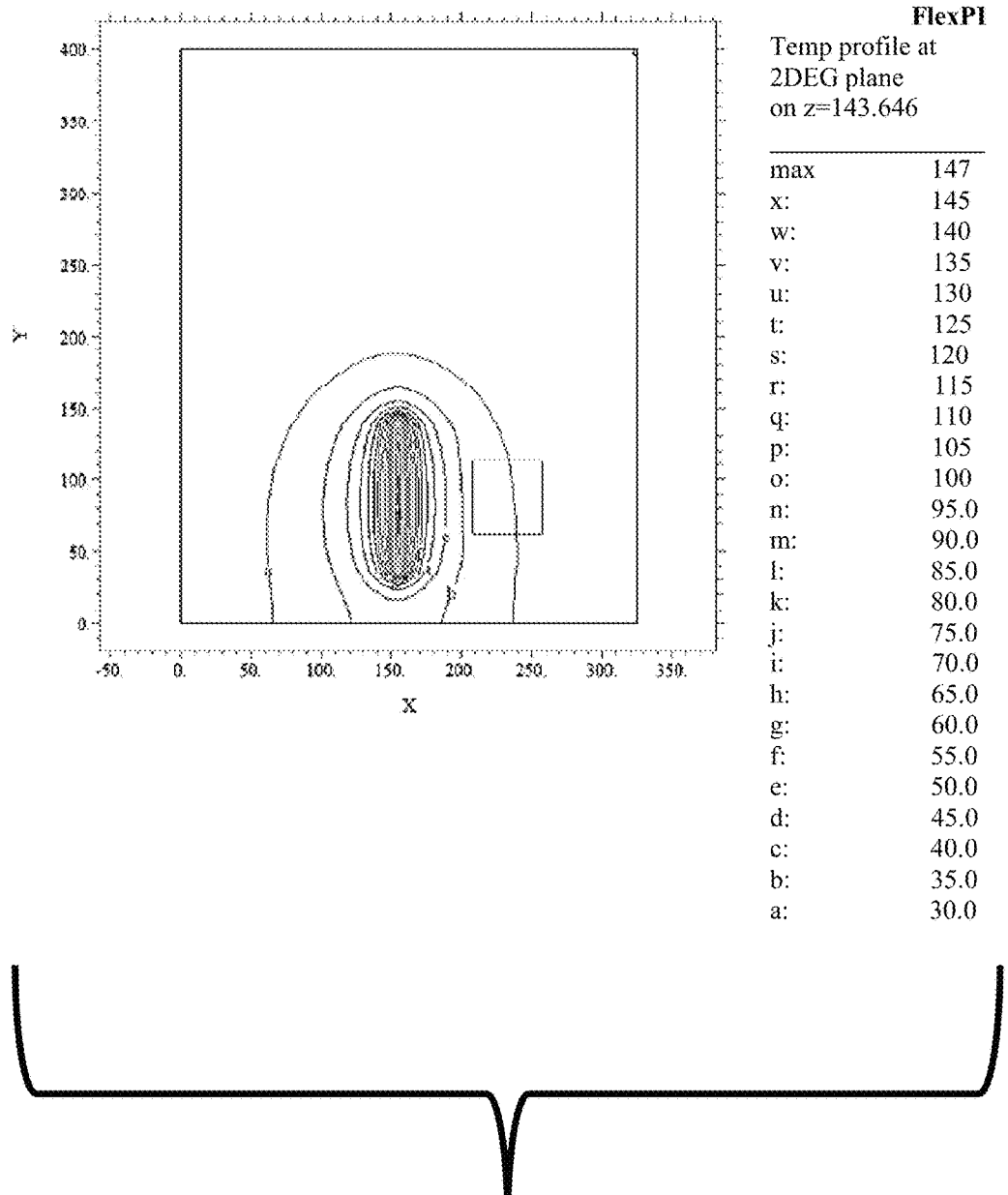
FIG. 24 displays 2-dimensional temperature contours at the plane of 2DEG of the reference HEMT with a through-wafer source-contact via-hole.
Figure 25:
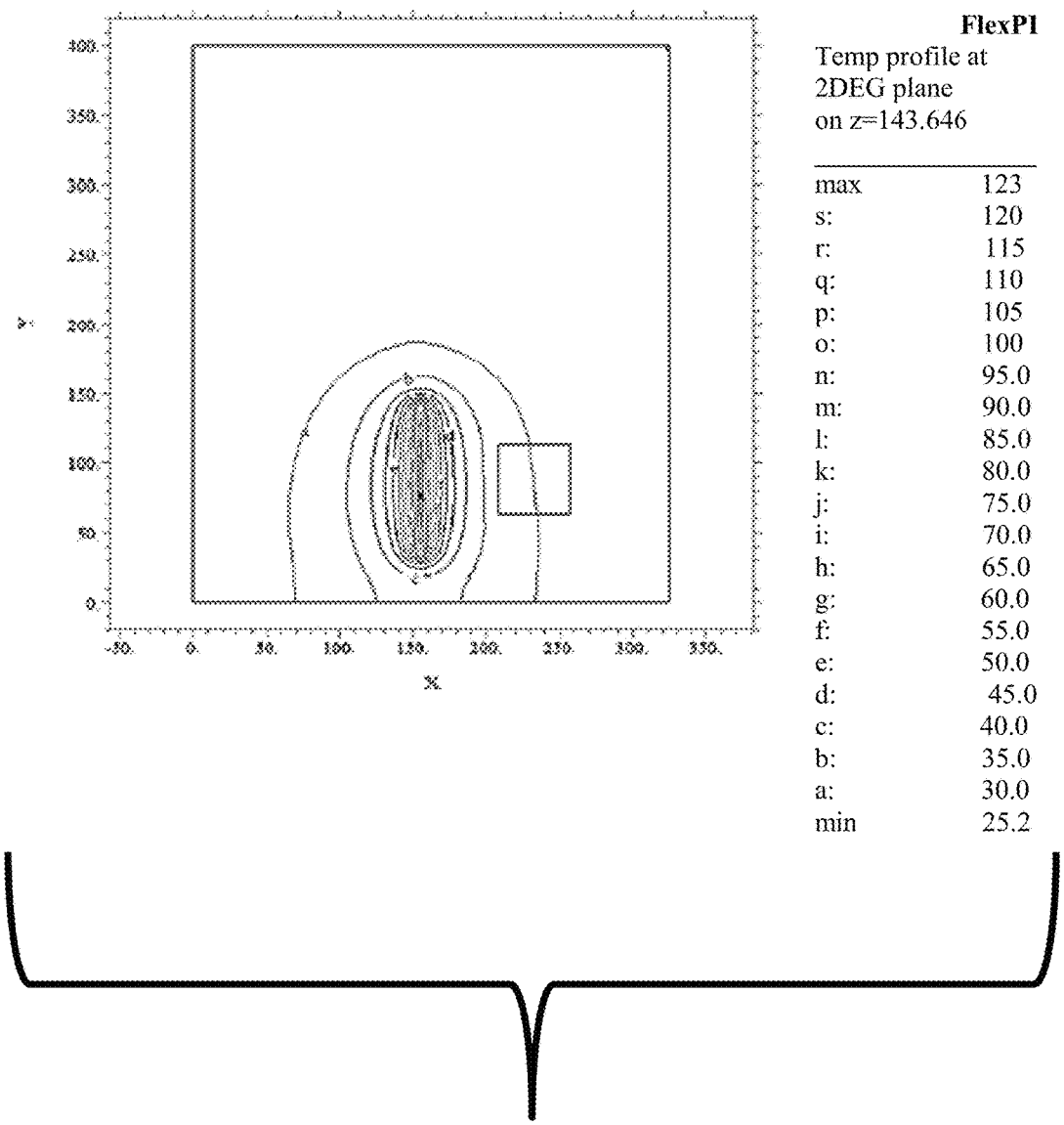
FIG. 25 shows 2-dimensional temperature contours at the plane of 2DEG of the HEMT with both a through-wafer source-contact via-hole and an additional Si-substrate via-hole under the active area filled with copper simulated at a power density of 5 W/mm.

FIGS. 24 and 25 show 2-dimensional temperature contours on the plane of a 2DEG channel for the reference HEMT with a through-wafer source-contact via-hole and the HEMT with both a through-wafer source-contact via-hole and an additional Si-substrate via-hole under the active area filled with copper, respectively, simulated at a power density of 5 W/mm. The gradient of the temperature distribution may be much larger, and the temperature may drop to less than 35° C. for the region 30 µm away from the gate area. Since the through-wafer source-contact via-hole may be placed 50 µm away from the gate finger, it could not effectively assist in the heat dissipation. By contrast, when the through-Si via-hole is placed directly under the active area with a distance of 2.2 µm between the gate finger and via-hole, the heat generated in the 2DEG channel could be effectively dissipated from under the active area.

Figure 26:
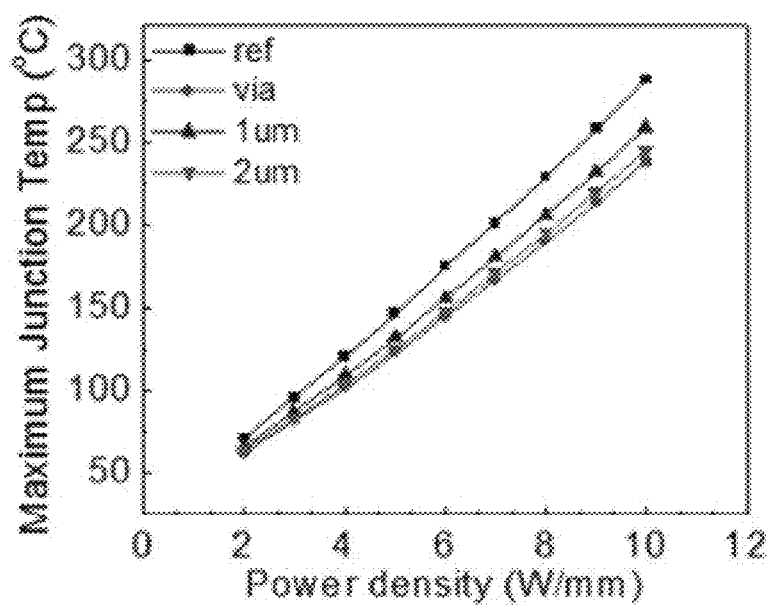
FIG. 26 displays the maximum junction temperature as a function of power density for the reference HEMT with a through-wafer source-contact via-hole, the HEMT with an additional through Si-substrate via-hole under the active area filled with copper, and the HEMT with both a through-wafer source-contact via-hole and an additional Si-substrate via-hole under the active area filled with 1 μm or 2 μm copper.

FIG. 26 displays the maximum junction temperature as a function of power density for the reference HEMT with a through-wafer source-contact via-hole, the HEMT with an additional through Si-substrate via-hole under the active area filled with copper, and the HEMT with both a through-wafer source-contact via-hole and an additional Si-substrate via-hole under the active area filled with 1 µm or 2 µm copper. As shown in FIG. 26, the maximum junction temperature is directly proportional to the power consumption of the HEMT. For the reference HEMT, the maximum junction temperature increased around 28° C. per watt of power consumption. On the other hand, the maximum junction temperature may only increase by 23° C. per watt of power consumption for the HEMTs with a 6 µm×100 µm through Si via-hole filled with plated copper under the active area. The effect of the plated copper thickness inside the via-hole on the maximum junction temperature has been investigated, as shown in FIG. 26. The heat transfer mechanism inside the via-hole without filling any metal may be dominated by free convection, which is a couple of orders less efficient than that of heat conduction. Thus the via-holes have to be filled with plated metal to achieve better step coverage. However, as shown in FIG. 26, with 1 µm thick copper around the via-hole, the maximum junction temperature changing rate may be reduced to 25° C. per watt of heat dissipation. When the copper thickness increased to 2 µm, the maximum junction temperature increase rate may be 23.8° C. per watt of power consumption, which is very close to the rate of 23° C. per watt of heat consumption for the via-hole completely filled with plated copper.

Figure 27:
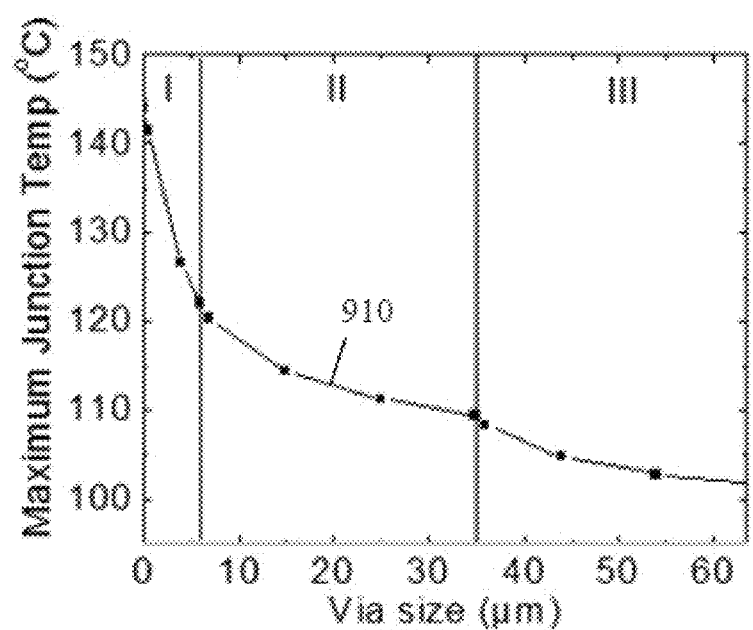
FIG. 27 shows the effect of the through Si substrate via-hole location on the maximal junction temperature; region I—through Si substrate via-hole located directly under the gate finger, region II—through Si substrate via-hole opened under the area between the source and drain, the transfer length region on the edge of the source and drain Ohmic contacts as well as the source metal contact, region III—through Si substrate via-hole opened for region II and under the area of drain Ohmic contact.

FIG. 27 shows the effect of the through Si substrate via-hole location on the maximal junction temperature; region I—through Si substrate via-hole located directly under the gate finger, region II—through Si substrate via-hole opened under the area between the source and drain, the transfer length region on the edge of the source and drain Ohmic contacts as well as the source metal contact, region III—through Si substrate via-hole opened for region II and under the area of drain Ohmic contact. The simulation results presented for the HEMT with a through Si substrate via-hole may be based upon the via-hole covering the regions of 4 µm between source and drain contacts as well as 1 µm of the transfer length on each side the Ohmic metal electrode. The majority of the heat generation of the HEMT is typically within these two regions. Thus the maximum junction temperature increases dramatically when the opening of the through Si substrate via-hole may be symmetrically decreased around the gate finger, as shown in the area designated in FIG. 27 as region I.

The maximum junction temperature may increase from 120° C. for the HEMT with a 6 µm wide through Si substrate via-hole to 146° C. for the HEMT without the through Si substrate via-hole. Region II of FIG. 27 shows the impact of expanding the width of the through Si substrate via-hole under the source Ohmic metal contact on the maximum junction temperature. The maximum junction temperature continuously decreases as the width of the via-hole increases due to larger areas of thermal resistive layer being removed and replaced with a less resistive copper layer. Since this through Si substrate via-hole may be electrically connected to the conventional source via-hole, this via-hole may be treated as a backside source field plate. Thus this via-hole may not only reduce the maximum junction temperature but may also reduce the maximum electric field around the gate edges to increase the drain breakdown voltage. The gate-source capacitance for HEMTs with the through Si substrate via-hole in the region II of FIG. 27 may be the same as the HEMT with 6 µm wide through Si substrate via-hole. The maximum junction temperature can be further reduced by extending the width of the through Si substrate via-hole to under the drain Ohmic contact, as shown in region III of FIG. 27, but the gate-source and source-drain feed-back capacitance may significantly increase and degrade the RF performance of the HEMTs.

In summary, this novel approach of implementing an additional through Si-substrate via-hole under the active area of HEMT can reduce the maximal junction temperature. For AlGaN/GaN structures grown on Si substrates, the AlN nucleation layer on the Si substrate is a very defective and thermally resistive layer, which causes inefficient heat dissipation. The proposed through Si-substrate via-hole provides access to this AlN nucleation layer. Based on the simulation result, the maximum junction temperature may be significantly decreased by removing this thermally resistive layer and plating Cu or Au to fill the via-holes. At a 5 W/mm condition, the maximum junction temperature of the reference HEMT was 144° C., while the maximum junction temperature decreased to 120° C. for the HEMT with an additional through Si-substrate via-hole under the active area of HEMT. Besides reducing the maximal junction temperature, since this through Si-substrate via-hole may be electrically connected to the conventional source via-hole, it acts as a backside source field plate. This via-hole may also reduce the maximum electric field around the gate edges and increase the drain breakdown voltage. If this through Si-substrate via-hole is separately connected to the front gate pad, it can behave as a back gate to improve front gate modulation.

It should be understood that the examples and embodiments described herein are for illustrative purposes only and that various modifications or changes in light thereof will be suggested to persons skilled in the art and are to be included within the spirit and purview of this application.

What is claimed is:

1. A semiconductor device having improved heat dissipation, comprising:
    a substrate including a top surface and a bottom surface;
    a nucleation layer on the top surface of the substrate;
    a transition layer on top of the nucleation layer;
    a buffer layer on top of the transition layer;
    a channel layer on top of the buffer layer;
    a barrier layer on top of the channel layer;
    a gate disposed on the barrier layer;
    a via passing through the substrate and the nucleation layer, exposing a bottom of the transition layer, and aligned directly under the gate; and
    an electrically conductive metal layer on the bottom surface of the substrate, the metal layer completely filling the via and extending from the bottom surface of the substrate to the bottom of the transition layer above the nucleation layer.

2. The semiconductor device according to claim 1, wherein the barrier layer comprises AlGaN, InAlN or AlN.

3. The semiconductor device according to claim 1, wherein the transition layer comprises AlGaN layers with different aluminum concentrations.

4. The semiconductor device according to claim 1, wherein the buffer layer comprises a GaN layer.

5. The semiconductor device according to claim 1, wherein the nucleation layer is an AlN or an AlGaN layer.

6. The semiconductor device according to claim 1, wherein the substrate comprises silicon or silicon carbide.

7. The semiconductor device according to claim 1, wherein the metal layer comprises gold, silver, copper, at least one refractory metal, or a combination thereof.

8. The semiconductor device according to claim 1, wherein the channel layer and the buffer layer are formed of the same material.

9. The semiconductor device according to claim 8, further comprising a thin interfacial layer on top of the channel layer.

10. The semiconductor device according to claim 9, wherein the thin interfacial layer comprises AlN and the channel layer comprises GaN.

11. The semiconductor device according to claim 1, further comprising a cap layer on the buffer layer.

12. The semiconductor device according to claim 1, wherein the metal layer further fills a second via extending from the bottom surface of the substrate to a bottom of a metal interconnect pad overlying the barrier layer.

13. The semiconductor device according to claim 12, wherein the metal interconnect pad is a source connection pad and the metal layer forms a backside source field plate.

14. The semiconductor device according to claim 12, wherein the metal interconnect pad is a gate connection pad and the metal layer forms a backside gate field plate.

15. A method for fabricating high electron mobility transistor (HEMT) with improved heat dissipation, the method comprising:
    providing a transistor on a substrate, wherein a nucleation layer is on the top surface of the substrate and a transition layer is on the nucleation layer below the transistor; and
    forming a first metal-filled via that extends from a bottom surface of the substrate to a bottom of the transition layer and is aligned directly under a gate of the transistor,
    wherein the first metal-filled via is completely filled with an electrically conductive metal layer and passes through the nucleation layer.

16. The method of claim 15, wherein forming the first metal-filled via comprises:
    etching the substrate to form a first via aligned under the gate of the transistor and exposing the nucleation layer;
    etching the exposed nucleation layer through the first via in the substrate, enlarging the first via to extend from the bottom surface of the substrate to the bottom of the transition layer on the nucleation layer; and
    filling the first via with the electrically conductive metal layer.

17. The method of claim 16, further comprising:
    etching a second via in the substrate under a metal interconnect pad, extending from the bottom surface of the substrate to a bottom surface of the metal interconnect pad; and
    filling the second via with the electrically conductive metal layer.

18. The method of claim 17, wherein the metal interconnect pad is a source connection pad.

19. The method of claim 17, wherein the metal interconnect pad is a gate connection pad.

* * * * *